(12) United States Patent
Subramanian et al.

(10) Patent No.: US 6,592,932 B2
(45) Date of Patent: Jul. 15, 2003

(54) NOZZLE ARM MOVEMENT FOR RESIST DEVELOPMENT

(75) Inventors: Ramkumar Subramanian, San Jose, CA (US); Khoi A. Phan, San Jose, CA (US); Bharath Rangarajan, Santa Clara, CA (US); Bhanwar Singh, Morgan Hill, CA (US); Michael K. Templeton, Atherton, CA (US); Sanjay K. Yedur, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 205 days.

(21) Appl. No.: 09/814,131

(22) Filed: Mar. 21, 2001

(65) Prior Publication Data

US 2003/0068430 A1 Apr. 10, 2003

Related U.S. Application Data

(62) Division of application No. 09/430,001, filed on Oct. 29, 1999, now Pat. No. 6,248,175.

(51) Int. Cl.[7] .................................................. B05D 3/12
(52) U.S. Cl. ............................ 427/10; 427/9; 427/240; 427/425; 118/52; 118/320; 438/758
(58) Field of Search ................................ 427/240, 425, 427/9, 10; 118/52, 320; 438/758

(56) References Cited

U.S. PATENT DOCUMENTS

| 4,564,280 A | | 1/1986 | Fukuda ........................ 354/317 |
|---|---|---|---|
| 4,997,552 A | | 3/1991 | Schlinkmann et al. ....... 209/552 |
| 5,089,305 A | | 2/1992 | Ushijima et al. ............ 427/422 |
| 5,275,658 A | | 1/1994 | Kimura ....................... 118/302 |
| 5,393,624 A | * | 2/1995 | Ushijima ...................... 430/30 |
| 5,474,877 A | | 12/1995 | Suzuki ........................ 430/325 |
| 5,555,234 A | | 9/1996 | Sugimoto .................... 354/317 |
| 5,562,772 A | * | 10/1996 | Neoh ........................... 118/52 |
| 5,625,433 A | | 4/1997 | Inada et al. .................. 396/604 |
| 5,678,116 A | | 10/1997 | Sugimoto et al. ........... 396/611 |
| 5,820,677 A | | 10/1998 | Yonaha ....................... 118/680 |
| 5,821,035 A | * | 10/1998 | Hirano et al. ................ 430/311 |
| 5,826,130 A | | 10/1998 | Tanaka et al. ............... 396/611 |
| 5,885,661 A | | 3/1999 | Batcheider ................... 427/425 |
| 5,885,755 A | | 3/1999 | Nakagawa et al. .......... 430/325 |
| 5,939,130 A | * | 8/1999 | Shiraishi et al. ............... 427/9 |
| 5,942,037 A | | 8/1999 | Wagener et al. ............. 118/315 |
| 5,962,070 A | | 10/1999 | Mitsuhashi et al. .......... 427/240 |
| 5,972,426 A | * | 10/1999 | Kutsuzawa et al. .......... 427/240 |
| 6,004,047 A | * | 12/1999 | Akimoto et al. ............. 396/604 |
| 6,033,475 A | * | 3/2000 | Hasebe et al. ............... 118/320 |
| 6,221,787 B1 | * | 4/2001 | Ogata .......................... 438/758 |
| 6,376,013 B1 | * | 4/2002 | Rangarajan et al. ......... 427/240 |

* cited by examiner

*Primary Examiner*—Shrive P. Beck
*Assistant Examiner*—Kirsten Crockford Jolley
(74) *Attorney, Agent, or Firm*—Amin & Turocy, LLP

(57) ABSTRACT

A system and method is provided that facilitates the application of a uniform layer of developer material on a photoresist material layer. The system includes a nozzle adapted to apply a predetermined volume of developer material on a photoresist material layer along a linear path having a length approximately equal to the diameter of the photoresist material layer. A movement system moves the nozzle to a first position offset from a central region of the photoresist material layer for applying a first predetermined volume of developer material to the photoresist material layer while the developer material is spin coated. The movement system also moves the nozzle to a second position offset from the central region for applying a second predetermined volume of developer material to the photoresist material layer while the developer is spin coated. The first position is located on an opposite side of the central region with respect to the second position. A method of adjusting the offset position and/or volume of developer material applied at the first and second position is also provided. The method utilizes developed photoresist material layer thickness data provided by a measurement system to adjust the offset position and/or volume of the developer.

11 Claims, 10 Drawing Sheets

NOZZLE ARM MOVEMENT FOR RESIST DEVELOPMENT

This application is a Division of U.S. application Ser. No. 09/430,001, filed on Oct. 29, 2001, now U.S. Pat. No. 6,248,175.

TECHNICAL FIELD

The present invention generally relates to semiconductor processing, and in particular to a system for uniform development of a photoresist material layer on a wafer.

BACKGROUND OF THE INVENTION

In the semiconductor industry, there is a continuing trend toward higher device densities. To achieve these high densities there has been and continues to be efforts toward scaling down device dimensions (e.g., at submicron levels) on semiconductor wafers. In order to accomplish such high device packing density, smaller and smaller features sizes are required. This may include the width and spacing of interconnecting lines, spacing and diameter of contact holes, and the surface geometry such as corners and edges of various features.

The requirement of small features with close spacing between adjacent features requires high resolution photolithographic processes. In general, lithography refers to processes for pattern transfer between various media. It is a technique used for integrated circuit fabrication in which a silicon structure, is coated uniformly with a radiation-sensitive film, the resist, and an exposing source (such as optical light, x-rays, or an electron beam) illuminates selected areas of the surface through an intervening master template, the mask, for a particular pattern. The lithographic coating is generally a radiation-sensitive coating suitable for receiving a projected image of the subject pattern. Once the image is projected, it is indelibly formed in the coating. The projected image maybe either a negative or a positive image of the subject pattern. Exposure of the coating through a photomask causes the image area to become either more or less soluble (depending on the coating) in a particular solvent developer. The more soluble areas are removed in the developing process to leave the pattern image in the coating as less soluble polymer.

Due to the extremely fine patterns which are exposed on the photoresist material, thickness uniformity of the photoresist material is a significant factor in achieving desired critical dimensions. The photoresist material should be applied such that a uniform thickness is maintained in order to ensure uniformity and quality of the photoresist material layer. The photoresist material layer thickness typically is in the range of 0.1 to 3.0 microns. Good resist thickness control is highly desired, and typically variances in thickness should be less than ±10–20 Å across the wafer. Very slight variations in the photoresist material thickness may greatly affect the end result after the photoresist material is exposed by radiation and the exposed portions removed.

Application of the resist onto the wafer is typically accomplished by using a spin coater. The spin coater is essentially a vacuum chuck rotated by a motor. The wafer is vacuum held onto the spin chuck. Typically, a nozzle supplies a predetermined amount of resist to a center area of the wafer. The wafer is then accelerated to and rotated at a certain speed, and centrifugal forces exerted on the resist cause the resist to disperse over the whole surface of the wafer. The resist thickness obtained from a spin coating process is dependent on the viscosity of the resist material, spin speed, the temperature of the resist and temperature of the wafer.

After the resist is spin coated and selectively irradiated to define a predetermined pattern, the irradiated or unirradiated portions are removed by applying a developer. The developer is also spin coated onto the wafer by applying developer across the resist and then spin coating the developer until centrifugal forces disperse the developer over the coating of resist. However, the developer is not always uniformly dispersed on the wafer because the of the difference of the surface area on the outer peripheral portion of the wafer in comparison to the center portion of the wafer. This may cause overdeveloping of the center portion of the resist on the wafer forming a developed resist layer with a thickness that is smaller at the center than at the outer peripheral surfaces. The result is the predetermined photoresist pattern cannot be formed.

The above stated problems even occur for nozzles that are designed to dispense developer more uniformly, such as a multiple tip dispensing nozzles. Typically, a multiple tip dispensing nozzle includes a chamber for receiving developer that distributes developer to a plurality of nozzles distributed over the length of the nozzle, which extends the diameter of the wafer. FIGS. 1a and 1b illustrate typical problems that can occur in applying developer to a resist on a wafer with a multiple tip nozzle. A multiple tip nozzle 10 is coupled to a pivotable arm 12 that pivots from a rest position 11 to an operating position 15. In the operating position 15, the multiple tip nozzle applies a developer 30 on a resist layer 24 disposed on a wafer 22. The wafer 22 is vacuum held onto a rotating chuck 20 driven by a shaft 26 coupled to a motor 28. The wafer 22 with its coating of resist 24 is rotated at a constant speed and developer 30 is applied through a plurality of tips 14 along a central axis through of the resist layer 24. The tips 14 are aligned at different points along the central axis to apply developer along different annular rings (not shown). The developer 30 flows outward from each annular ring covering the entire top surface of the resist layer 24. FIG. 1a illustrates an example of the problems that can occur after the developer with the irradiated resin portions are spun off the wafer and/or rinsed off the wafer. The center portion of the resist is exposed to more developer due to puddling in the center region of the wafer. As a result, a groove 18 is formed in the central region of the resist resulting in a non-uniformly exposed wafer.

FIG. 1c illustrates a proposed solution for the above described problem. The nozzle 10 is offset from the central axis of the resin 24, so that puddling does not occur in the center of the resist layer 24. This solves the problem with puddling in the central region of the resist layer 24, but due to offset portion lagtime, one side of the wafer receives more developer than the other. FIG. 1d illustrates that the exposed resist layer 24 includes a first surface 34 that is more exposed than a second surface 32 causing a difference in the thickness of the resist 24 along the first and second surface. Again, this undesireability causes a non-uniformly exposed wafer.

The resulting developed resist layers illustrated in FIGS. 1b and 1d do not have uniform thicknesses which may lead to impaired device performance. In view of the above, a system/method is needed, for dispensing a uniform layer of developer across a resist formed on a wafer.

SUMMARY OF THE INVENTION

The present invention provides for a system and method that facilitates the application of a uniform layer of developer on a photoresist material layer. The present invention accomplishes this end by utilizing a developer application system that includes a multiple tip nozzle and a movement system that moves the nozzle to a first position offset a predetermined distance from a central axis of a photoresist material layer, and applies a predetermined volume of developer at this first position. The system then moves the nozzle to a second position offset from the same central axis a predetermined distance at the opposite side of the central axis with respect to the first axis, and applies a predetermined volume of developer at this second position, such that the longitudinal axis of the nozzle in the first and the second position is parallel to the central axis. The predetermined positions, distances and volumes are those positions, distances and volumes that allow for forming a uniformly thick layer of developer on the photoresist material layer that provides for a uniformly thick layer of developed photoresist material layer. These values are typically chosen based on historical data for the particular process being performed.

The present invention also provides a measurement system that measures the thickness uniformity of the developed photoresist material layer disposed on a test wafer. In one aspect of the invention, the thickness uniformity data can be utilized to adjust the volume of developer applied at the first and the second position. The thickness uniformity data can also be used to adjust the flow rate of the developer applied at each nozzle tip of the multiple tip nozzle. In another aspect of the invention, the thickness uniformity data can be used to adjust the offset position of the first and the second position with respect to the same central axis. The systems can be combined to provided for an adjustment of any of the offset positions, the volume of developer applied and the flow rate of the developer at each nozzle tip onto the photoresist material layer.

One particular aspect of the invention relates to a system for applying a developer material onto a photoresist material layer disposed on a substrate to provide a uniformly thick layer of developer material. The layer of developer material is spincoated onto the substrate by a rotating chuck coupled to a motor. The system includes a nozzle adapted to apply a predetermined volume of developer on a photoresist material layer along a linear path having a length approximately equal to the diameter of the substrate and a movement system adapted to move the nozzle to a first position offset from a central region of the photoresist material for applying a first predetermined volume of developer onto the photoresist material while it is spin coated and adapted to move the nozzle to a second position offset from the central region for applying a second predetermined volume of developer onto the photoresist material while it is spin coated. The first position is located on an opposite side of the central region with respect to the second position.

Another aspect of the present invention relates to a system for applying a developer material onto a photoresist material layer disposed on a substrate to provide a uniformly thick layer of developer material. The layer of developer material is spincoated onto the substrate by a rotating chuck coupled to a motor. The system includes a nozzle adapted to apply a predetermined volume of developer on a photoresist material layer along a linear path having a length approximately equal to the diameter of the substrate and a movement system adapted to move the nozzle to a first position offset from a central region of the photoresist material for applying a first predetermined volume of developer to the photoresist material while it is spin coated and adapted to move the nozzle to a second position offset from the central region for applying a second predetermined volume of developer to the photoresist material while it is spin coated. The first position is located on an opposite side of the central region with respect to the second position. The system also includes a measuring system adapted to measure the thickness of the layer of photoresist material that has been developed by the developer material and a processor operatively coupled to the measuring system and a volume control system. The processor receives thickness data from the measuring system and the processor using the data to provide adjustment information to the volume control system for adjusting the volume of developer applied to at least one of the first position and the second position, so that a layer of developed photoresist material having a more uniform thickness can be achieved for a subsequent substrate.

Another aspect of the present invention relates to a system for applying a developer material onto a photoresist material layer disposed on a substrate to provide a uniformly thick layer of developer material. The layer of developer material is spincoated onto the substrate by a rotating chuck coupled to a motor. The system includes a nozzle adapted to apply a predetermined volume of developer on a photoresist material layer along a linear path having a length approximately equal to the diameter of the substrate and a movement system adapted to move the nozzle to a first position offset from a central region of the photoresist material for applying a first predetermined volume of developer to the photoresist material while it is spin coated and adapted to move the nozzle to a second position offset from the central region for applying a second predetermined volume of developer to the photoresist material while it is spin coated. The first position is located on an opposite side of the central region with respect to the second position. The system also includes a measuring system adapted to measure the thickness of the layer of photoresist material that has been developed by the developer material and a processor operatively coupled to the measuring system and an offset movement system. The processor receives thickness data from the measuring system and the processor using the data to provide adjustment information to the offset movement system for adjusting the offset location of at least one of the first position and the second position, so that a layer of developed photoresist material having a more uniform thickness can be achieved for a subsequent substrate.

Yet another aspect of the present invention relates to a system for applying a developer material onto a photoresist material layer disposed on a substrate to provide a uniformly thick layer of developer material. The layer of developer material is spincoated onto the substrate by a rotating chuck coupled to a motor. The system includes means for applying a predetermined volume of developer on a photoresist material layer along a linear path having a length approximately equal to the diameter of the substrate and means for moving the nozzle to a first position offset from a central region of the photoresist material for applying a first predetermined volume of developer to the photoresist material while it is spin coated and a second position offset from the central region for applying a second predetermined volume of developer to the photoresist material while it is spin coated, the first position being located on an opposite side of the central region with respect to the second position.

Still yet another aspect of the present invention relates to a method for applying a developer with a multiple tip nozzle onto a photoresist material layer disposed on a substrate to provide a uniformly thick layer of developer material. The layer of developer material is spincoated onto the substrate by a rotating chuck coupled to a motor. The method includes the steps of spinning the photoresist material layer at a predetermined speed, moving the nozzle to a first position offset from a central region of the photoresist material layer and applying a first position predetermined volume of developer, moving the nozzle to a second position offset from a central region of the photoresist material layer on an oppose side of the central region with respect to the first position and applying a second position predetermined volume of developer, spin coating the substrate until the developer forms a layer on the photoresist material, stopping the spinning of the substrate until the developer develops the photoresist material, measuring the thickness of the developed photoresist material layer at a variety of areas on the photoresist material layer and generating data based on the measurements, determining the thickness uniformity of the layer based on the data and adjusting one of the first position, second position, the first position predetermined volume and the second position predetermined volume.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1A:
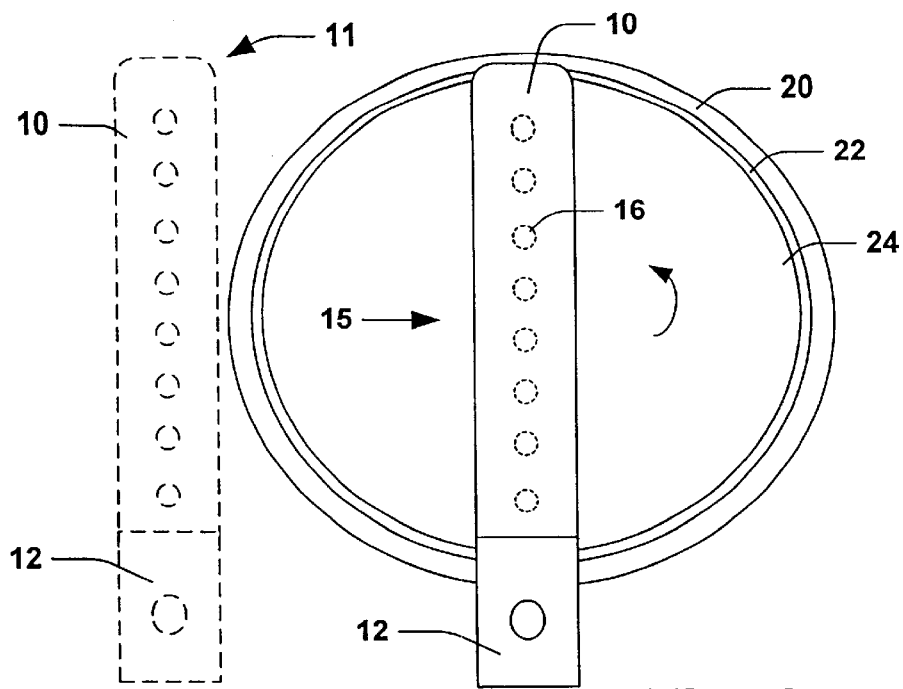
FIG. 1a illustrates a top view of a developer material application system in accordance with the prior art.
Figure 1B:
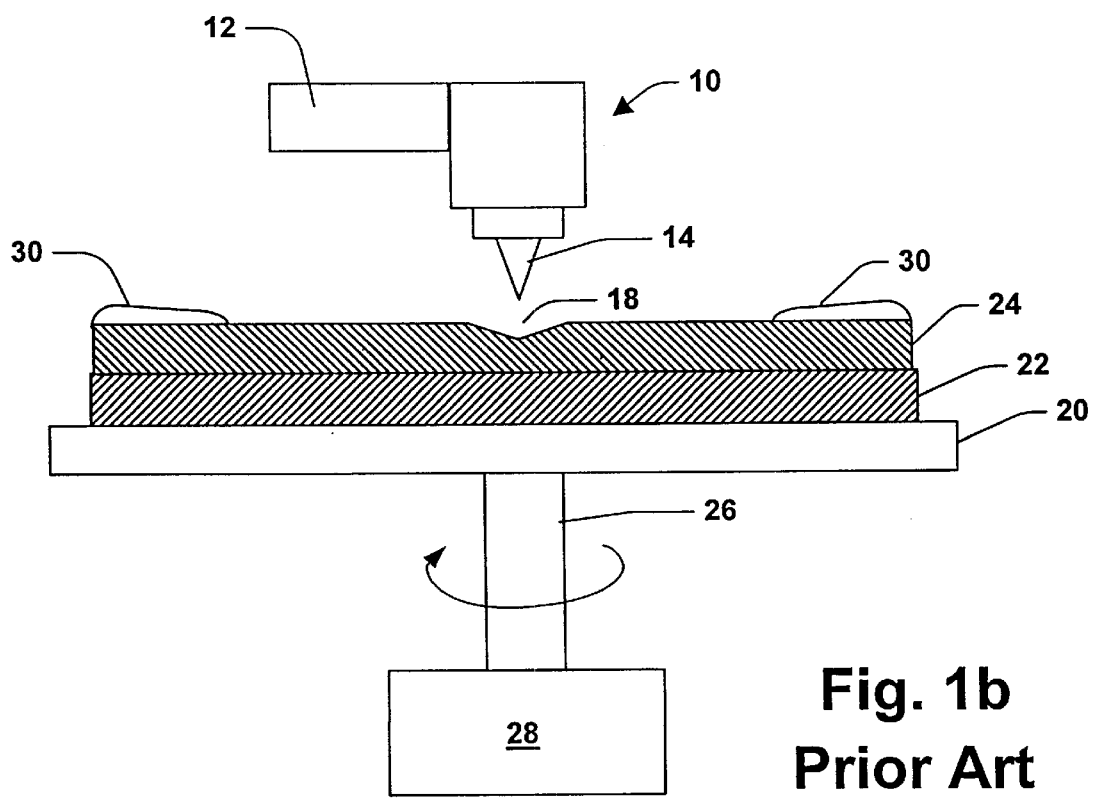
FIG. 1b illustrates a side view of the developer application system of FIG. 1a illustrating one problem with the system in accordance with the prior art.
Figure 1C:
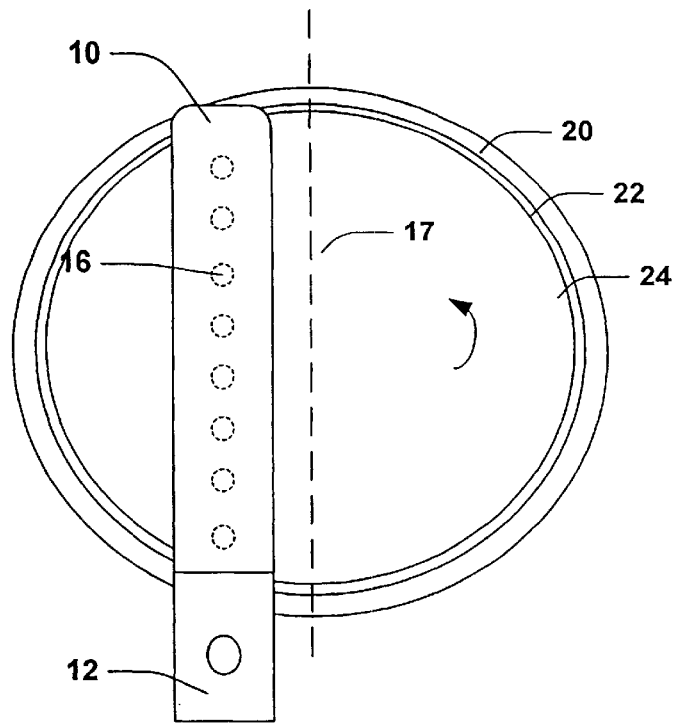
FIG. 1c illustrates a top view of a developer application system correcting the problem illustrated in FIG. 1b in accordance with the prior art.
Figure 1D:
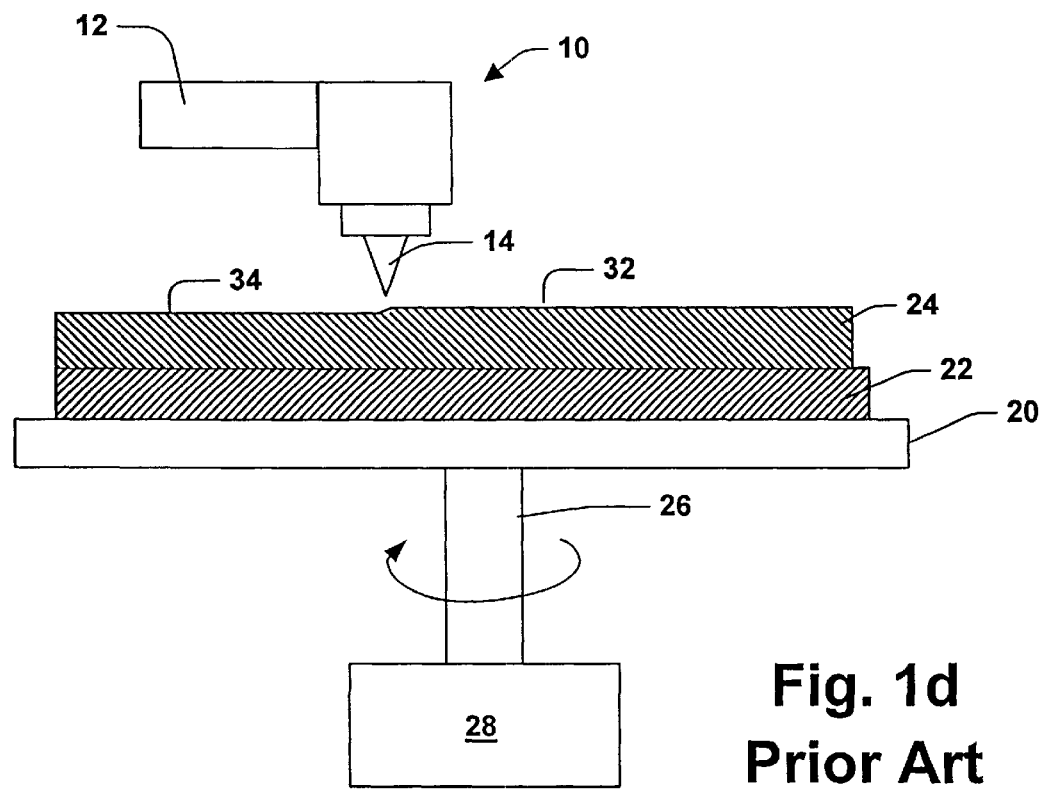
FIG. 1d illustrates a side view of a developer material application system of FIG. 1c illustrating one problem with the system in accordance with the prior art.

The present invention will now be described with reference to the drawings, wherein like reference numerals are used to refer to like elements throughout. The present invention will be described with reference to a system for controlling the thickness of a developer spin coated onto a photoresist material layer in order to form a uniformly developed or patterned photoresist. It should be understood that the description of these preferred embodiments are merely illustrative and that they should not be taken in a limiting sense.

Figure 2A:
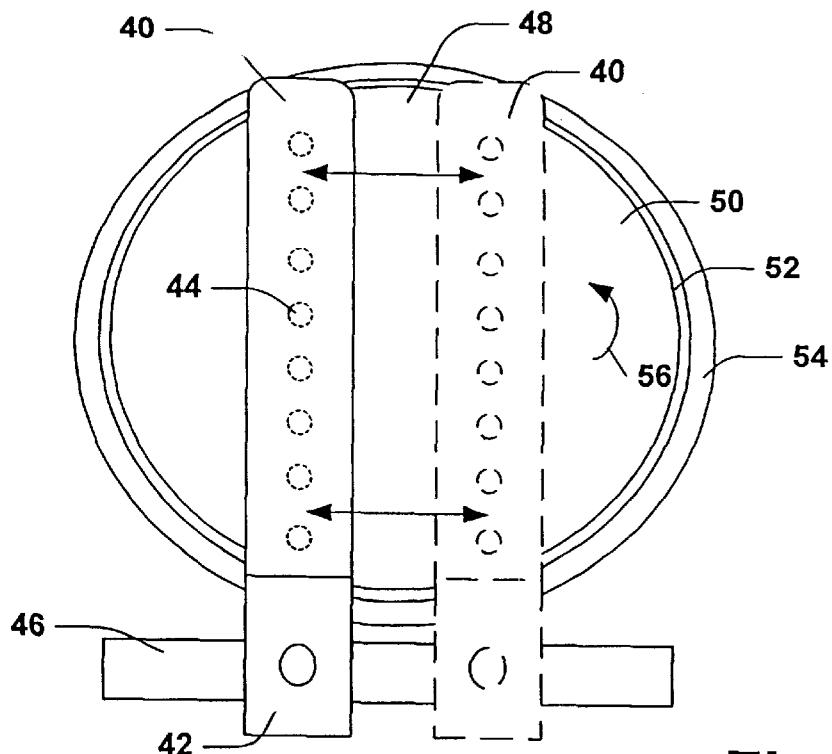
FIGS. 2a–2b illustrate a top view of a developer material application system in accordance with the present invention.

Referring initially to FIG. 2a, a photoresist material layer 50 is formed on a wafer 52 located on a spin chuck 54. A multiple tip developer nozzle 40 coupled to a pivotable arm 42 is movable along a side bar 46. The nozzle moves between a first position offset from a central region 48 of the photoresist material layer 50 and a second position (shown in ghost) offset from the central region 48. The first position is disposed at a location on the opposite side of the central region 48 with respect to the second position. The nozzle moves to the first offset position and applies developer through a plurality of nozzle tips along an axis parallel to a central axis of the photoresist material layer 50. The chuck is spun in a first rotational direction 46 and a predetermined volume of developer is applied to the photoresist material layer 50. The nozzle 40 is then moved to the second offset position and a second predetermined volume of developer is applied to the photoresist material layer 50. The application of the developer on offset sides of the central region evens out the developer applied over the wafer and eliminates the unevenness due to offset portion lagtime. It should be appreciated that the volume of developer applied at the second offset position may be less than the volume applied at the first offset position due to the fact that the developer used at the second position is used to even out the developed portion of the photoresist material layer 50. Any deviation of a uniformly developed photoresist thickness can be corrected by adjusting the volume that the nozzle applies in both its first and second offset position, until the desired uniformity is achieved.

Figure 2B:
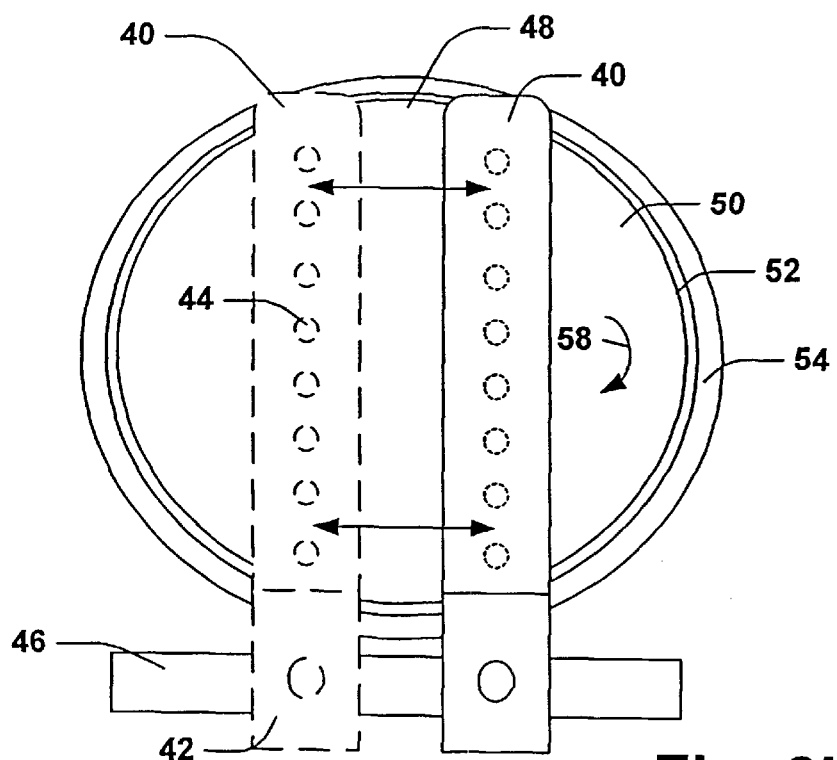
Figure 3:
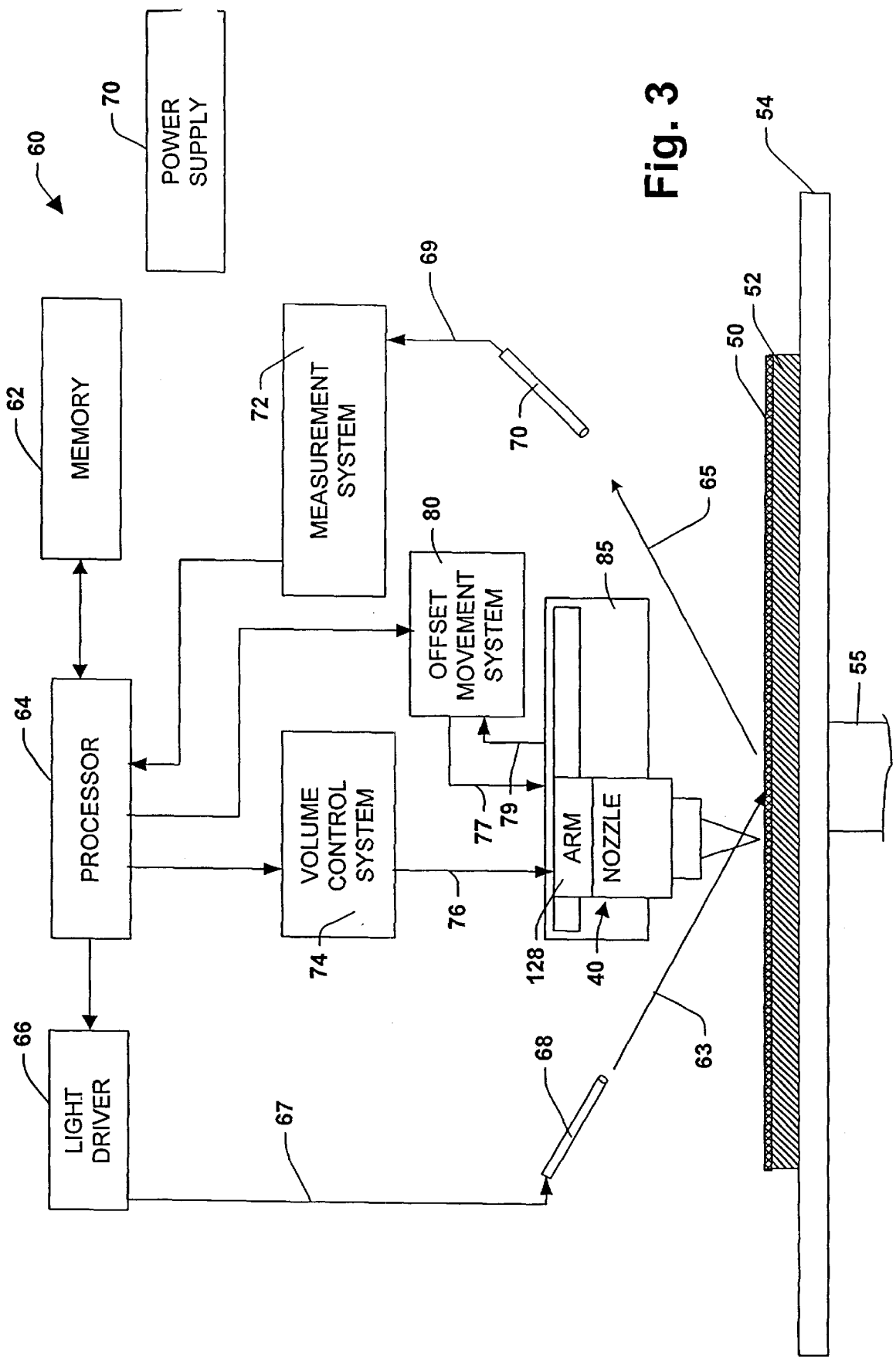
FIG. 3 illustrates a partial schematic block diagram of a measurement and volume control system in accordance with the present invention.

FIG. 2b illustrates another aspect of the present invention where the developer is applied by the nozzle 40 in the same way as described in FIG. 2a with respect to the first offset position. However, after application of the developer in the first position, the chuck 54 stops and begins rotating in a second rotational direction 58 opposite the first rotational direction 56. The nozzle 40 then moves to the second offset position where it applies a predetermined volume of developer while the chuck is rotating in the second direction 58. The predetermined volume of developer applied in the first position can be the same as, more than, or less than the predetermined volume of developer in the second direction. Any deviation of a uniformly developed photoresist thickness can be corrected by adjusting the distance that the nozzle is offset from the central region or central axis in both its first and second offset position, until the desired thickness uniformity is achieved. FIG. 3 illustrates a system employing the present invention as it relates to adjustment of the predetermined volume of developer applied to the photoresist material layer 50 at the first and the second offset positions, as discussed with respect to FIG. 2a. FIG. 3 illustrates a system 60 for applying a uniformly thick layer of a developer over a photoresist material layer 50 on a substrate 52. The substrate 52 is vacuum held onto a rotating chuck 54, which is spin rotated by a shaft 55 driven by a motor (not shown). It is to be appreciated that although the present invention is primarily described within the context of applying a uniformly thick layer of developer over a layer of photoresist material or achieving a uniformly thick developed photoresist material layer, it is to be understood that the present invention may be applied to applying uniform layers of top and bottom anti-reflective coatings, low K dielectric materials, spin-on-glass (SOG) and other spin-on materials.

The system 60 further includes a thickness measurement system 72. A light source 68 is connected by a fiber optic line 67 to a light driver 66. The light driver 66 is turned on and off for thickness measurements of the photoresist material layer 50 by a processor 64. The light source 68 sends a ray of light 63 at the resist layer 34, which is reflected as a ray of light 65 to a light receiver 70 which is coupled to the measurement system 72 for making resist thickness measurements. The light receiver 70 is connected to the measurement system 72 by a fiber optic line 69. In another embodiment, the light source 68 and the light receiver 70 is rotatable so that thickness measurements can be performed at various points along the photoresist material layer 50. In yet another embodiment, the light source 68 comprises a plurality of fiber optic connections and light sources and light receiver 70 includes a plurality of fiber optic connections, and light receivers for detecting thickness along different points of the resist layer.

Any suitable interferometry system and/or spectrometry system may be employed to carry out the present invention and such systems are intended to fall within the scope of the hereto appended claims. In one embodiment, the measurement system 72 is a polychromatic interferometer system or a monochromatic interferometer system to measure the resist thickness. In another embodiment, the measurement system 72 is a spectrometry system. Interferometry systems and spectrometry systems are well known in the art, and therefore further discussion related thereto is omitted for sake of brevity.

The processor 64 receives the measured data from the measuring system 72 and determines the overall thickness and the thickness uniformity of the developed photoresist material layer 50 by classical signal analysis and estimation algorithms. The processor 64 is programmed to control and operate the various components within the developer application system 60 in order to carry out the various functions described herein. The manner in which the processor 64 can be programmed to carry out the functions relating to the present invention will be readily apparent to those having ordinary skill in the art based on the description provided herein.

A memory 62 which is operatively coupled to the processor 64 is also included in the system 60 and serves to store program code executed by the processor 64 for carrying out operating functions of the system 60 as described herein. The memory 62 includes read only memory (ROM) and random access memory (RAM). The ROM contains among other code the Basic Input-Output System (BIOS) which controls the basic hardware operations of the system 60. The RAM is the main memory into which the operating system and application programs are loaded. The memory 62 also serves as a storage medium for temporarily storing information such as developer material volume settings, offset position settings, developed photoresist material coordinate tables, interferometry information, spectrometry information and other data which may be employed in carrying out the present invention. For mass data storage, the memory 62 may include a hard disk drive (e.g., 10 Gigabyte hard drive).

Power supply 70 provides operating power to the system 60. Any suitable power supply (e.g., battery, line power) may be employed to carry out the present invention.

The processor 64 is also coupled to a volume flow control system 74. The volume flow control system 74 is operatively coupled to an arm 128 holding the nozzle 40, which applies developer to the resist material layer 50 located on substrate 52. The total volume of the developer applied at the first offset position and the second offset position and the ratio of the developer applied with respect to the first and second positions is maintained by an electronically controlled valve controlled by a control line 76 of the volume flow control system 74.

The processor 64 is also electronically coupled to an offset movement system 80 that provides movement of arm 128 and nozzle 40 along a movement system 85. The movement system could move the arm 128 and the nozzle 40 utilizing a stepper motor (not shown) or the like to the first and the second offset positions. The specific location of the offset positions is provided by the processor 64 to the offset movement system 80, which controls the movement of the arm 128 and nozzle 40 by a control line 77. The movement system 85 provides feedback position information via a feedback line 79 to the offset movement system 80. This information can be used to correct the position of the nozzle 40 or can be communicated to the processor 64 for further analysis.

Figure 4:
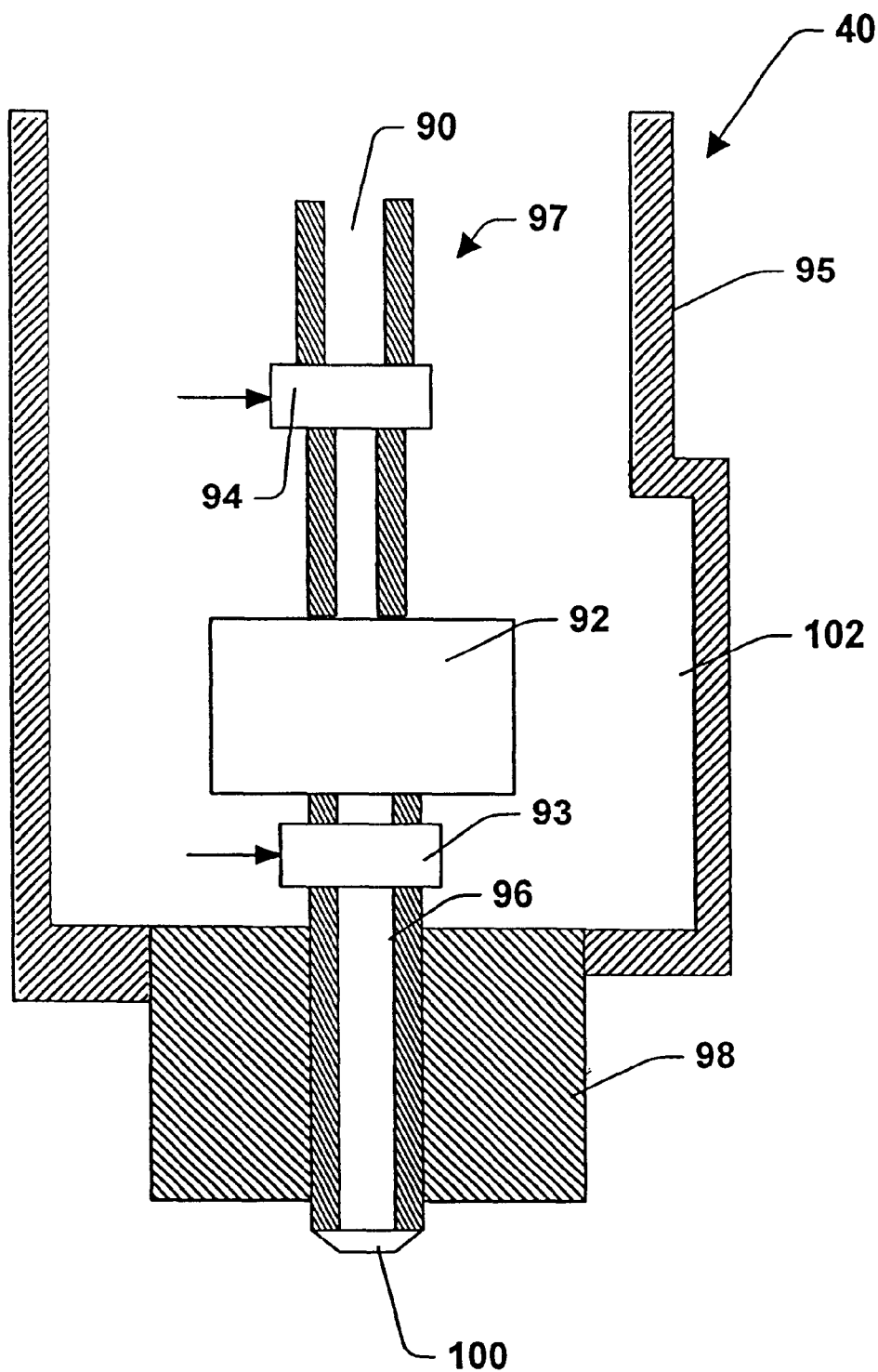
FIG. 4 illustrates a cross-sectional view of a nozzle in accordance with the present invention.

Referring now to FIG. 4, the nozzle 40 includes a holder 95 defining a chamber 102 that holds a plurality of nozzle tips assemblies 97. Each nozzle tip assembly 97 includes a developer supply tube 90 with one end disposed in the holder 95 and the other end connected to a supply of developer material (not shown). A volume control valve 94 controls the volume of developer received into a receiving chamber 92 from the developer supply tube 90. A collar 98 is connected to the bottom of the holder 95 and includes a central aperture for allowing a development supply barrel 96 to pass therethrough. The collar 98 threadingly engages the holder 98. Supply barrel 96 is connected to the receiving chamber 92 on one end and passes through the center of collar 98. The supply barrel 96 includes a liquid discharge opening 100 that discharges the developer to the photoresist material layer 50. A predetermined volume of developer is received in the receiving chamber 92 depending on the setting of the volume control valve 94. The chamber 92 and the tip 100 cooperate to deposit developer at a controlled flow rate on to the photoresist material layer 50. A second control valve 93 could be placed between the receiving chamber 92 and the liquid discharge opening 100 for selectively controlling the developer flow rate from the receiving chamber to the photoresist material layer. In one embodiment, a single receiving chamber is used to supply developer to the plurality of nozzle tips and supply barrels.

Figure 5:
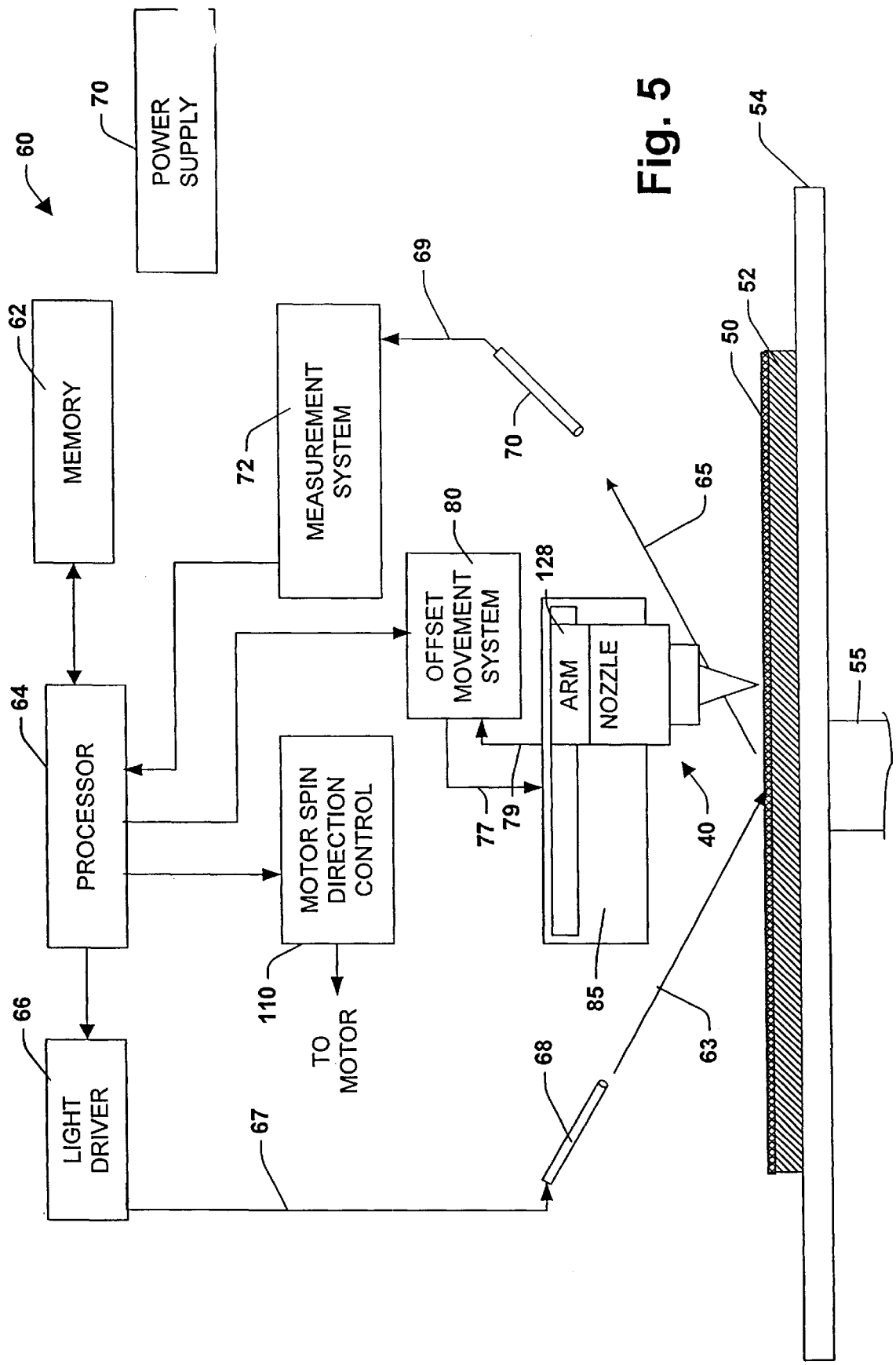
FIG. 5 illustrates a partial schematic block diagram of a measurement and offset movement control system in accordance with the present invention.

FIG. 5 illustrates a system employing the present invention as it relates to adjustment of the first and second offset position for applying a predetermined volume of developer at the first and the second offset positions, as discussed with respect to FIG. 2b. Like reference numerals were used for like parts and description of which has been omitted for the sake of brevity. The processor 64 is coupled to a motor spin direction control system 110, which controls the rotational direction of the spin motor. As previously discussed with respect to FIG. 2b, developer is applied at the first offset location while the photoresist material layer 50 is spun in the first rotational direction, and the developer is applied at the second offset location while the photoresist material layer 50 is spun at a second rotational direction, opposite the first rotational direction. The total volume of the developer applied at the first offset position and the second offset position and the ratio of the developer applied with respect to the first and second positions is predetermined, and the only adjustment made to the system illustrated in FIG. 5 is the change in the distance of the first and second offset positions with respect to a central axis of the photoresist material layer 50. The processor 64 communicates to the offset movement system 80 that provides movement of the arm 128 and the nozzle 40 along the movement system 85. The specific location of the offset positions is provided by the processor 64 to the offset movement system 80, which controls the movement of the arm 128 and nozzle 40 by a control line 77. The movement system 85 provides feedback position information via a feedback line 79 to the offset movement system 80, so that the processor 64 can determine where the offset positions are currently and change those positions based on thickness measurements of developed photoresist material layer 50. This information can be constantly updated in real time to correct the position of the nozzle 40 with respect to its first and second offset positions, until a uniform combination is achieved.

Figure 6:
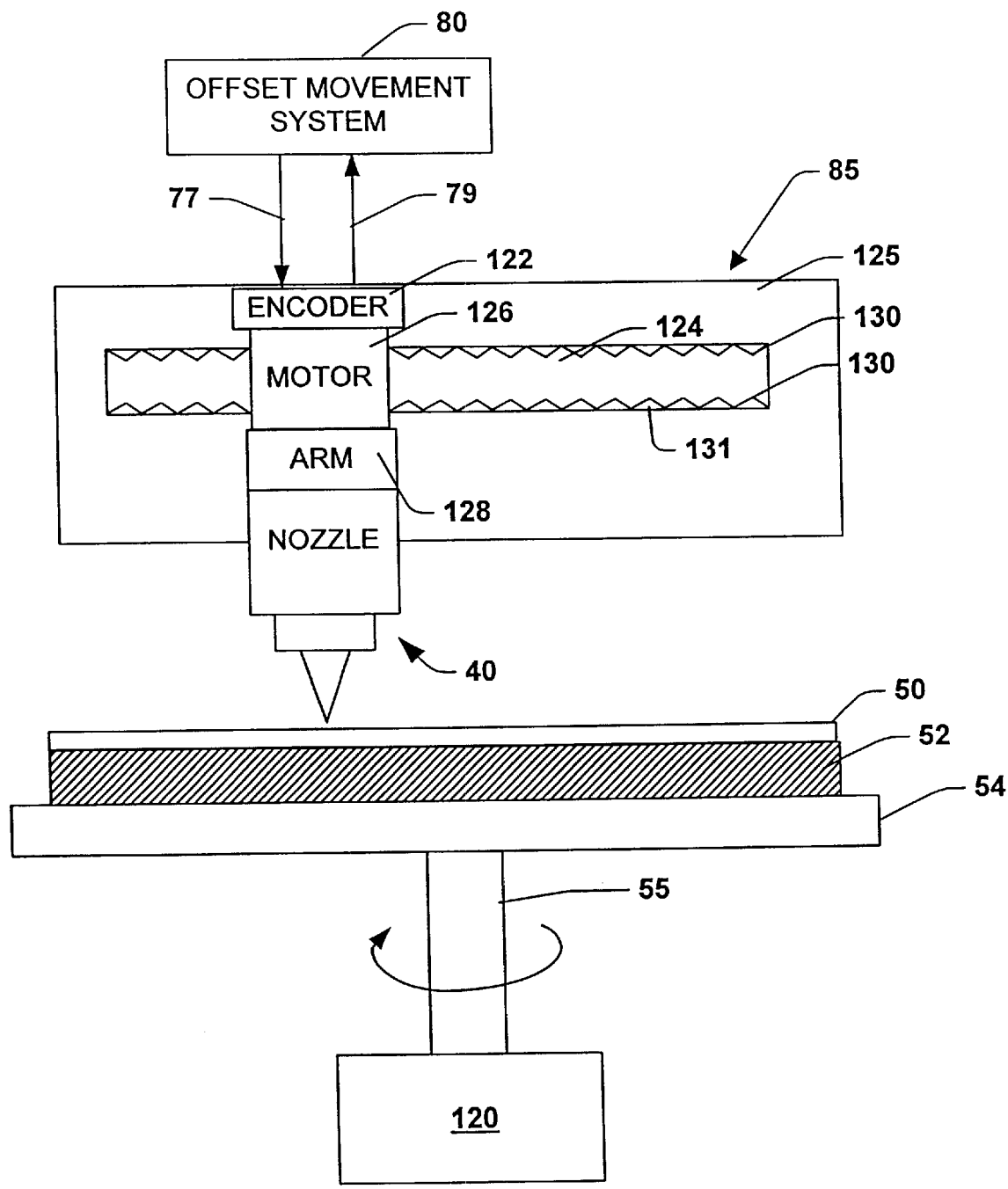
FIG. 6 illustrates a front view of the offset movement control system in accordance with the present invention.

FIG. 6 illustrates implementation of one particular example of the movement system 85 employed in the present invention. The movement system 85 includes a slide bar 125 having an opening 124. The opening 124 includes a top path of gears or teeth lined along an upper surface and a bottom path of gears or teeth along a lower surface to form a track 131. A motor 126 is attached to the arm 128 holding the nozzle 40 above the photoresist material layer 50. The motor 126 includes a shaft (not shown) with complementary gears or teeth that mate with the top and bottom path of gears or teeth, so movement of the shaft along the track 131 causes the motor to move linearly, which in turn moves the nozzle between the first and second offset positions. The position location is controlled by control line 77 from offset movement system 80. The actual position information is provided by an encoder 122 to the offset movement system 80 via the feedback line 79. The distance of the first and the second offset positions can be adjusted based on thickness measurements of the developed photoresist material layer 50. In an alternate embodiment, the movement system 85 moves the arm 128 utilizing a belt or pulley system.

Figure 7:
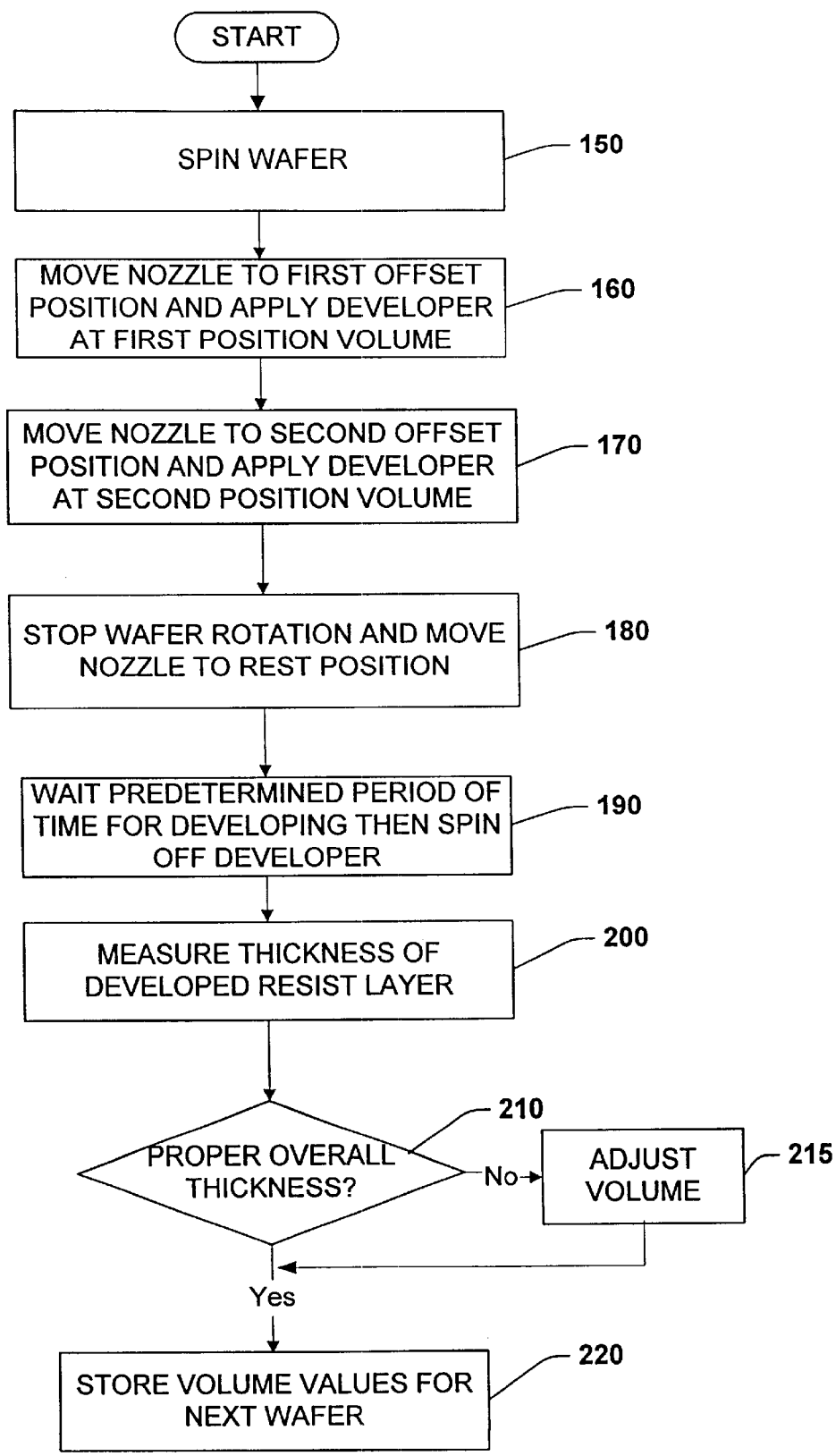
FIG. 7 is a flow diagram illustrating one specific methodology for carrying out the measurement and volume adjustment system in accordance with the present invention.

FIG. 7 is a flow diagram illustrating one particular methodology for carrying out the present invention with respect to the system illustrated in FIG. 3. In step 150, the test wafer 52 with the photoresist material layer 50 is rotated on the rotating chuck 54, and the processor 64 performs a general initialization routine to the developer application system 60. In step 160, the nozzle 40 is moved to the first offset position and developer is applied at a predetermined volume to the photoresist material layer 50. In step 170, the nozzle 40 is moved to the second offset position and developer is applied at a predetermined volume to the photoresist material layer 50. In step 180, the motor 120 is stopped, causing the wafer 52 and photoresist material layer 50 to stop rotating and the nozzle 40 is returned to its rest position. In step 190, the system 60 waits a predetermined amount of time until the developing of the photoresist material layer 50 is complete, and then rotates the wafer 52 to spin off the developer. In an alternate embodiment, the developer and the irradiated or unirradiated resist portions could be rinsed off the photoresist material layer 50 using water or another available solution. The measurement system 72 then measures the thickness of the developed photoresist material layer 50 on the wafer 52 at various locations along the wafer 52 in step 200. In step 210, the processor 64 compares the measured thickness uniformity with the desired thickness uniformity, and determines whether or not the proper thickness uniformity has been achieved within predefined tolerances. If no, the processor 64 enters an adjustment routine to adjust the volume and/or ratio of the developer being applied at the first and the second offset positions in step 215. In step 220, the processor 64 stores the previous or adjusted volume values to be used for the next wafer.

Figure 8:
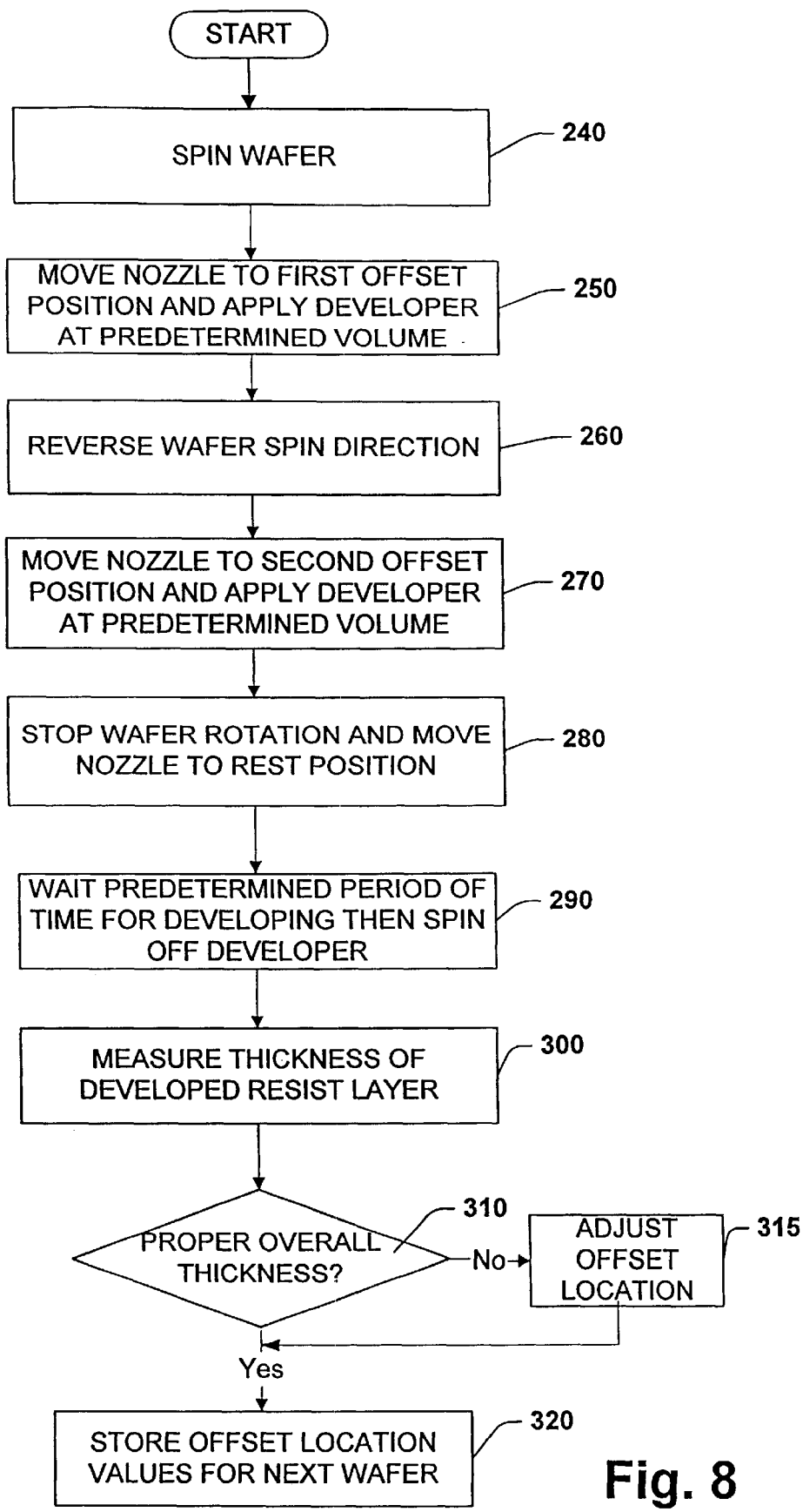
FIG. 8 is a flow diagram illustrating one specific methodology for carrying out the measurement and the offset movement control system in accordance with the present invention.

FIG. 8 is a flow diagram illustrating one particular methodology for carrying out the present invention with respect to the system illustrated in FIG. 5. In step 240, the test wafer 52 with the photoresist material layer 50 is rotated on the rotating chuck 54, and the processor 64 performs a general initialization routine to the developer application system 60. In step 250, the nozzle 40 is moved to the first offset position and developer is applied at a predetermined volume to the photoresist material layer 50. In step 260, the wafer 52 is spun in the reverse direction. In step 270, the nozzle 40 is moved to the second offset position and developer is applied at a predetermined volume to the photoresist material layer 50. In step 280, the motor 120 is stopped, causing the wafer 52 and photoresist material layer 50 to stop rotating and the nozzle 40 is returned to its rest position. In step 290, the system 60 waits a predetermined amount of time until the developing of the photoresist material layer 50 is complete, and then rotates the wafer 52 to spin off the developer. The measurement system 72 then measures the thickness of the developed photoresist material layer 50 on the wafer 52 at various locations along the wafer 52 in step 300. In step 310, the processor 64 compares the measured thickness uniformity with the desired thickness uniformity, and determines whether or not the proper thickness uniformity has been achieved within predefined tolerances. If no, the processor 64 enters an adjustment routine to adjust the offset location of either the first offset position, the second offset position or both. In step 320, the processor 64 stores the previous or adjusted offset location values to be used for the next wafer.

Figure 9:
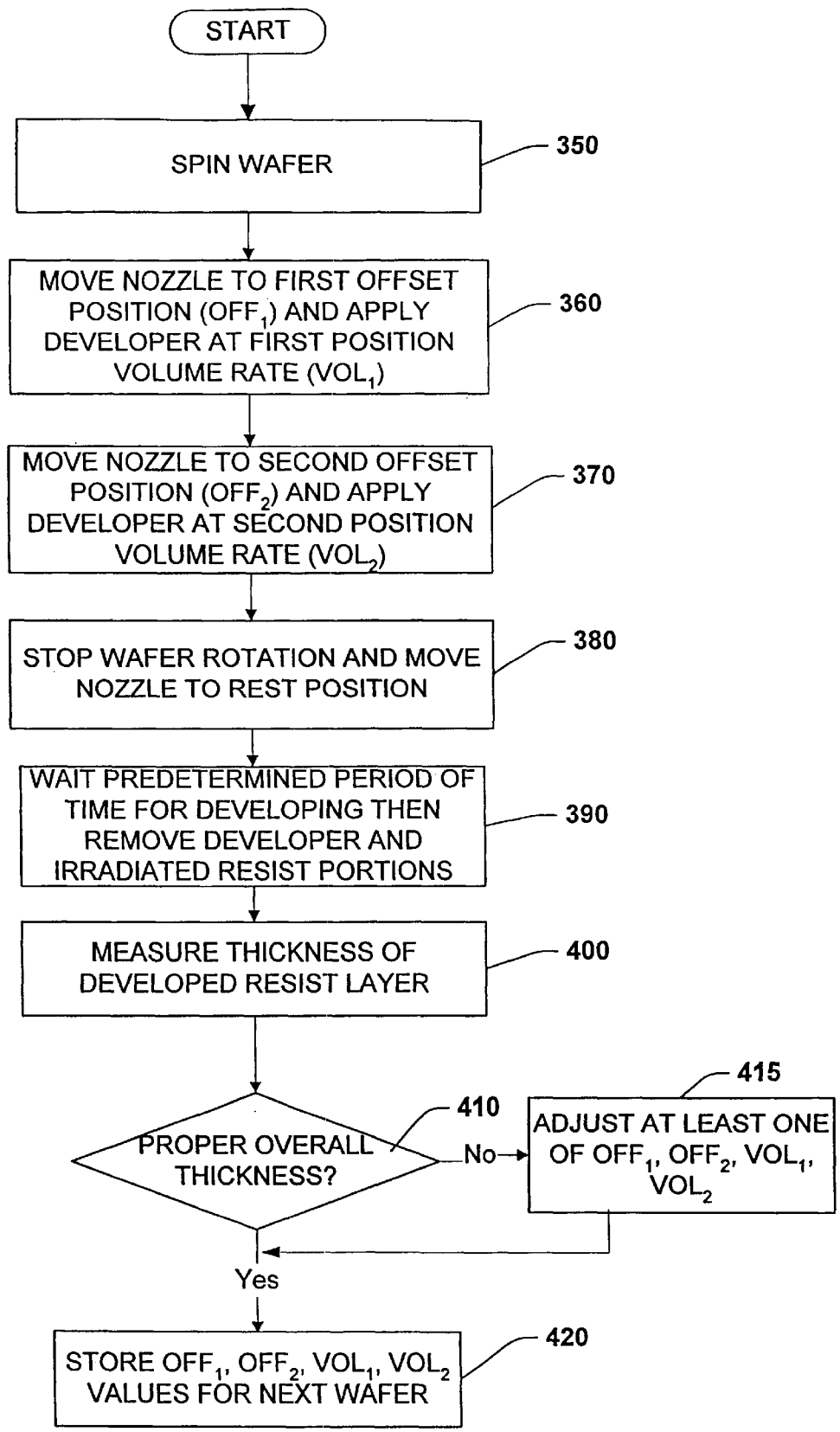
FIG. 9 is a flow diagram illustrating one specific methodology for carrying out the present invention using a combined system of the systems illustrated in FIG. 3 and FIG. 5.

FIG. 9 is a flow diagram illustrating one particular methodology for carrying out the present invention with respect to a combined system including the components illustrated in FIGS. 3 and 5. In step 350, the test wafer 52 with the photoresist material layer 50 is rotated on the rotating chuck 54, and the processor 64 performs a general initialization routine to the developer material application system 60. In step 360, the nozzle 40 is moved to the first offset position ($OFF_1$) and developer is applied at a predetermined volume first position volume rate ($VOL_1$) to the photoresist material layer 50. In step 370, the nozzle 40 is moved to the second offset position ($OFF_2$) and developer is applied at a predetermined volume second position volume rate ($VOL_2$) to the photoresist material layer 50. Instep 380, the motor 120 is stopped, causing the wafer 52 and photoresist material layer 50 to stop rotating and the nozzle 40 is returned to its rest position. In step 390, the system 60 waits a predetermined amount of time until the developing of the photoresist material layer 50 is complete. The measurement system 72 then measures the thickness of the developed photoresist material layer 50 on the wafer 52 at various locations along the wafer 52 in step 400. In step 410, the processor 64 compares the measured thickness uniformity with the desired thickness uniformity, and determines whether or not the proper thickness uniformity has been achieved within predefined tolerances. If no, the processor 64 enters an adjustment routine to adjust at least one of the variables $OFF_1$, $OFF_2$, $VOL_1$ and $VOL_2$. In step 320, the processor 64 stores the previous or adjusted variables $OFF_1$, $OFF_2$, $VOL_1$ and $VOL_2$ values to be used for the next wafer.

What has been described above are preferred embodiments of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A method for applying a developer with a multiple tip nozzle onto a photoresist material layer disposed on a substrate to provide a uniformly thick layer of developer material, the developer material being spincoated onto the substrate by a rotating chuck coupled to a motor to provide the layer of developer material, the method comprising the steps of:

spinning the photoresist material layer at a predetermined speed;

moving the nozzle to a first position offset from a central region of the photoresist material layer and applying a first position predetermined volume of developer material;

moving the nozzle to a second position offset from a central region of the photoresist material layer on an opposite side of the central region with respect to the first position and applying a second position predetermined volume of developer material;

spin coating the substrate until the developer material forms a layer on the photoresist material layer;

stopping the spinning of the substrate until the developer material develops the photoresist material;

measuring the thickness of the developed photoresist material layer at a variety of areas on the photoresist material layer and generating data based on the measurements;

determining the thickness uniformity of the developed photoresist material layer based on the data; and adjusting one of the first position, second position, the first position predetermined volume and the second position predetermined volume.

2. The method of claim 1, further including the step of adjusting a predetermined volume flow rate for at least one of the applying the first position predetermined volume and the second position predetermined volume.

3. The method of claim 1, wherein the second predetermined volume of developer material is less than the first predetermined volume of developer material.

4. The method of claim 1, wherein the first position is located a distance from a central axis of the photoresist material layer that is different than a distance that the second position is located with respect to the same central axis.

5. The method of claim 1, wherein the nozzle is moved to the first position and moved to the second position using a pivotable arm moving along a slide bar.

6. The method of claim 1, wherein adjusting the first and second position is conducted by providing position information of the nozzle.

7. The method of claim 1, wherein the nozzle comprises a plurality of nozzle tip assemblies distributed along a longitudinal axis of the nozzle.

8. The method of claim 7, wherein each nozzle tip assembly comprises a receiving chamber adapted to receive a predetermined volume of developer material electronically controlled by a first control valve.

9. The method of claim 8, wherein each nozzle tip assembly further includes a second control valve adapted to control the flow rate of the developer material distributed onto the photoresist material layer.

10. A method for applying a developer material onto a photoresist material layer disposed on a substrate to provide a uniformly thick layer of developer material, the developer material being spincoated onto the substrate by a rotating chuck coupled to a motor to form the layer of developer material, comprising:

applying a predetermined volume of developer material on the photoresist material layer along a linear path having a length approximately equal to the diameter of the photoresist material layer;

moving the nozzle to a first position offset from a central region of the photoresist material layer for applying a first predetermined volume of developer material to the photoresist material layer while the developer material is spin coated and a second position offset from the central region for applying a second predetermined volume of developer material to the photoresist material layer while the developer material is spin coated, the first position being located on an opposite side of the central region with respect to the second position;

determining the thickness of a developed photoresist material layer at different regions on the substrate and producing data relating to the thickness of the developed photoresist material layer;

evaluating the data and determining the thickness uniformity of the developed photoresist material layer; and adjusting the offset location of at least one of the first position and the second position, so that a developed photoresist material layer having a more uniform thickness can be achieved for a subsequent substrate.

11. The method of claim 10, further comprising adjusting the volume of developer applied to at least one of the first position and the second position.

* * * * *